United States Patent
Ogawa et al.

(10) Patent No.: US 10,063,195 B2
(45) Date of Patent: Aug. 28, 2018

(54) AMPLIFIER CIRCUIT AND AMPLIFIER CIRCUIT IC CHIP

(71) Applicant: ASAHI KASEI MICRODEVICES CORPORATION, Tokyo (JP)

(72) Inventors: Tomohiko Ogawa, Tokyo (JP); Yoshihiko Koizumi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 635 days.

(21) Appl. No.: 14/428,480

(22) PCT Filed: Jun. 17, 2014

(86) PCT No.: PCT/JP2014/003258
§ 371 (c)(1),
(2) Date: Mar. 16, 2015

(87) PCT Pub. No.: WO2014/203525
PCT Pub. Date: Dec. 24, 2014

(65) Prior Publication Data
US 2015/0249434 A1    Sep. 3, 2015

(30) Foreign Application Priority Data
Jun. 19, 2013 (JP) ................. 2013-128654

(51) Int. Cl.
*G01P 15/12* (2006.01)
*H03F 1/56* (2006.01)
(Continued)

(52) U.S. Cl.
CPC .................. *H03F 1/56* (2013.01); *G01P 3/44* (2013.01); *G01P 3/487* (2013.01); *G01P 15/12* (2013.01);
(Continued)

(58) Field of Classification Search
CPC ..................................................... G01P 15/123
(Continued)

(56) References Cited

U.S. PATENT DOCUMENTS

| | | |
|---|---|---|
| 5,146,788 A | 9/1992 | Raynes |
| 5,396,439 A | 3/1995 | Yamada |

(Continued)

FOREIGN PATENT DOCUMENTS

| | | |
|---|---|---|
| EP | 0 440 916 A1 | 8/1991 |
| JP | S56-163782 U | 5/1983 |

(Continued)

OTHER PUBLICATIONS

Supplementary European Search Report dated Oct. 28, 2016, for corresponding European Patent Application No. 14814595.6.
(Continued)

*Primary Examiner* — John Chapman, Jr.
(74) *Attorney, Agent, or Firm* — Morgan, Lewis & Bockius LLP

(57) ABSTRACT

An amplifier circuit includes a converter configured to convert a predefined physical quantity to a resistance value, and the resistance value converted by the converter is converted to a voltage value and then amplified. The converter includes variable resistance sensors of piezoresistance elements. A bias unit is configured to determine a bias current of the converter, and includes bias resistances. An operation amplifier unit receives, as input signals, output signals from the bias unit and the converter, and includes feedback resistances respectively connected to input and output ends of a first operational amplifier. The first operational amplifier is a whole differential operational amplifier including a common-mode feedback circuit.

13 Claims, 8 Drawing Sheets

(51) Int. Cl.
*H03F 3/45* (2006.01)
*G01P 3/44* (2006.01)
*G01R 27/02* (2006.01)
*G01P 3/487* (2006.01)

(52) U.S. Cl.
CPC ............ *G01P 15/123* (2013.01); *G01R 27/02* (2013.01); *H03F 3/45071* (2013.01); *H03F 3/45475* (2013.01); *H03F 3/45932* (2013.01); *H03F 2200/261* (2013.01); *H03F 2200/294* (2013.01); *H03F 2200/504* (2013.01); *H03F 2200/555* (2013.01); *H03F 2203/45138* (2013.01); *H03F 2203/45336* (2013.01); *H03F 2203/45528* (2013.01); *H03F 2203/45591* (2013.01); *H03F 2203/45592* (2013.01)

(58) Field of Classification Search
USPC ...................................................... 73/514.33
See application file for complete search history.

(56) References Cited

U.S. PATENT DOCUMENTS

| | | | |
|---|---|---|---|
| 5,668,320 A * | 9/1997 | Cowan | G01L 9/065 73/708 |
| 6,177,840 B1 | 1/2001 | Opitz et al. | |
| 2002/0083776 A1 | 7/2002 | Tanizawa | |
| 2006/0130583 A1 | 6/2006 | Nakayama | |
| 2010/0253733 A1 | 10/2010 | Kato | |
| 2012/0297878 A1 | 11/2012 | Neul et al. | |

FOREIGN PATENT DOCUMENTS

| | | |
|---|---|---|
| JP | S58-69246 U | 5/1983 |
| JP | S58-069246 U | 5/1983 |
| JP | H04-265831 A | 9/1992 |
| JP | H05-045373 A | 2/1993 |
| JP | H05-207223 A | 8/1993 |
| JP | H05-085060 U | 11/1993 |
| JP | H11-271830 A | 10/1999 |
| JP | H11-284449 A | 10/1999 |
| JP | 2000-074733 A | 3/2000 |
| JP | 2002-148131 A | 5/2002 |
| JP | 2005-156251 A | 6/2005 |
| JP | 2006-174122 A | 6/2006 |
| JP | 2007-147575 A | 6/2007 |
| JP | 2010-243235 A | 10/2010 |
| JP | 2011-089943 A | 5/2011 |
| JP | 5055367 B2 | 8/2012 |
| WO | 2007/063955 A1 | 6/2007 |
| WO | 2009/016994 A1 | 2/2009 |

OTHER PUBLICATIONS

Leman et al., An inertial smart-sensor based on silicon nanowires for wireless sportive activity monitoring, IEEE 2011.
International Search Report dated Aug. 19, 2014 for International application No. PCT/JP2014/003258.
International Preliminary Report on Patentability dated Dec. 30, 2015, for corresponding International application No. PCT/JP2014/003258.

* cited by examiner

AMPLIFIER CIRCUIT AND AMPLIFIER CIRCUIT IC CHIP

TECHNICAL FIELD

The present disclosure relates to an amplifier circuit and an amplifier circuit IC chip, more particularly to an amplifier circuit configured to use a variable resistance that converts a predefined physical quantity into a resistance value, to convert the resistance value of the variable resistance into a voltage value, and to amplify the voltage, and an amplifier circuit IC chip having the same.

BACKGROUND ART

In one technology, there is known a sensor device in which a minute differential output voltage output from an output amplifier circuit having an instrumentation amplifier equipped with an offset adjustment function or from an acceleration sensor is amplified by the output amplifier circuit having the instrumentation amplifier.

Also, for example, PLT 1 discloses a sensor device that uses an output amplifier circuit having an instrumentation amplifier (i.e., amplifier for instrumentation) which amplifies a minute deviation voltage output from an acceleration sensor or the like, and an output amplifier circuit having an offset voltage adjustment circuit.

FIG. 1 is a circuit configuration view illustrative of an output amplifier circuit, in one technology, described in JP 2006-174122 A, and the sensor device that uses the output amplifier circuit. The output amplifier circuit uses the sensor technology of the variable resistance that converts a predefined physical quantity such as a piezoresistance into the resistance value. A resistance change of the variable resistance is converted into a voltage signal by a Wheatstone bridge circuit 20, and signals are amplified by an instrumentation amplifier 50.

In other words, an acceleration sensor 10 is configured with the Wheatstone bridge circuit 20 connected between the ground and a reference voltage input terminal 11 to which the reference voltage VREF is input. The Wheatstone bridge circuit 20 includes four piezoresistance elements 21 to 24 to detect a resistance change as a change in the bridge output voltage, and then outputs differential output voltages VIP and VIN to an output amplifier circuit 30.

In addition, the output amplifier circuit 30 has an instrumentation amplifier 50 configured with an offset voltage adjustment circuit 40 and operational amplifiers 51 to 53. The output amplifier circuit 30 further includes a first input terminal 31 to which the differential output voltage VIP is input, a second input terminal 32 to which the differential output voltage VIN is input, a first voltage input terminal 33 to which an offset voltage VOFFIN is input, a second voltage input terminal 34 to which a reference voltage VCOM, of the output from the instrumentation amplifier, that is a ½ voltage level of the reference voltage VREF, a reference voltage input terminal 35 to which the reference voltage VCOM is input, an output terminal 36 from which an amplifier circuit output voltage VOUT is output, an offset voltage adjustment circuit 40 with an output side being connected to the input terminal 33, and the instrumentation amplifier 50 with an input side being connected to the input terminals 31 to 34.

CITATION LIST

Patent Literature

PLT 1: JP 2006-174122 A

SUMMARY OF INVENTION

Technical Problem

However, as noise components affecting the SN ratio of the final output signal of the entire sensor that has been amplified, noises are generated not only by the acceleration sensor 10 but also by transistors at input parts of the first amplifier 51 and the second amplifier 52 connected to the acceleration sensor 10. The instrumentation amplifier 50 has two amplifiers connected to the sensor, and thus there are two sets of transistors, at the input parts, affecting the noises. Therefore, the noises are large in the configuration in one technology. Alternatively, the circuit area or power consumption having a trade-off relationship with the noises is large.

As described above, in the above-described JP 2006-174122 A, it is difficult to achieve a low noise in a simple circuit configuration, in signal processing of converting the resistance change of the variable resistance into a voltage signal and then amplifying the signal.

The present disclosure has been made in view of the above circumstances, and has an object to provide an amplifier circuit in which noise components are reduced and the circuit configuration is simplified, and an amplifier circuit IC chip.

Solution to Problem

The present disclosure has been made to achieve the above object and has the following configurations.

(1) There is provided an amplifier circuit (90), comprising: a first bias unit (81) connected to a first end of a first variable resistance sensor (71); a second bias unit (82) connected to a first end of a second variable resistance sensor (72), a second end of the first variable resistance sensor and a second end of the second variable resistance sensor being connected; and an I-V converter circuit (90) configured to convert currents output from the first end of the first variable resistance sensor and the first end of the second variable resistance sensor into voltages and output the voltages, respectively.

DESCRIPTION OF EMBODIMENTS

Embodiments of the present disclosure will be described with reference to the drawings.
(Embodiment 1)

Figure 1:
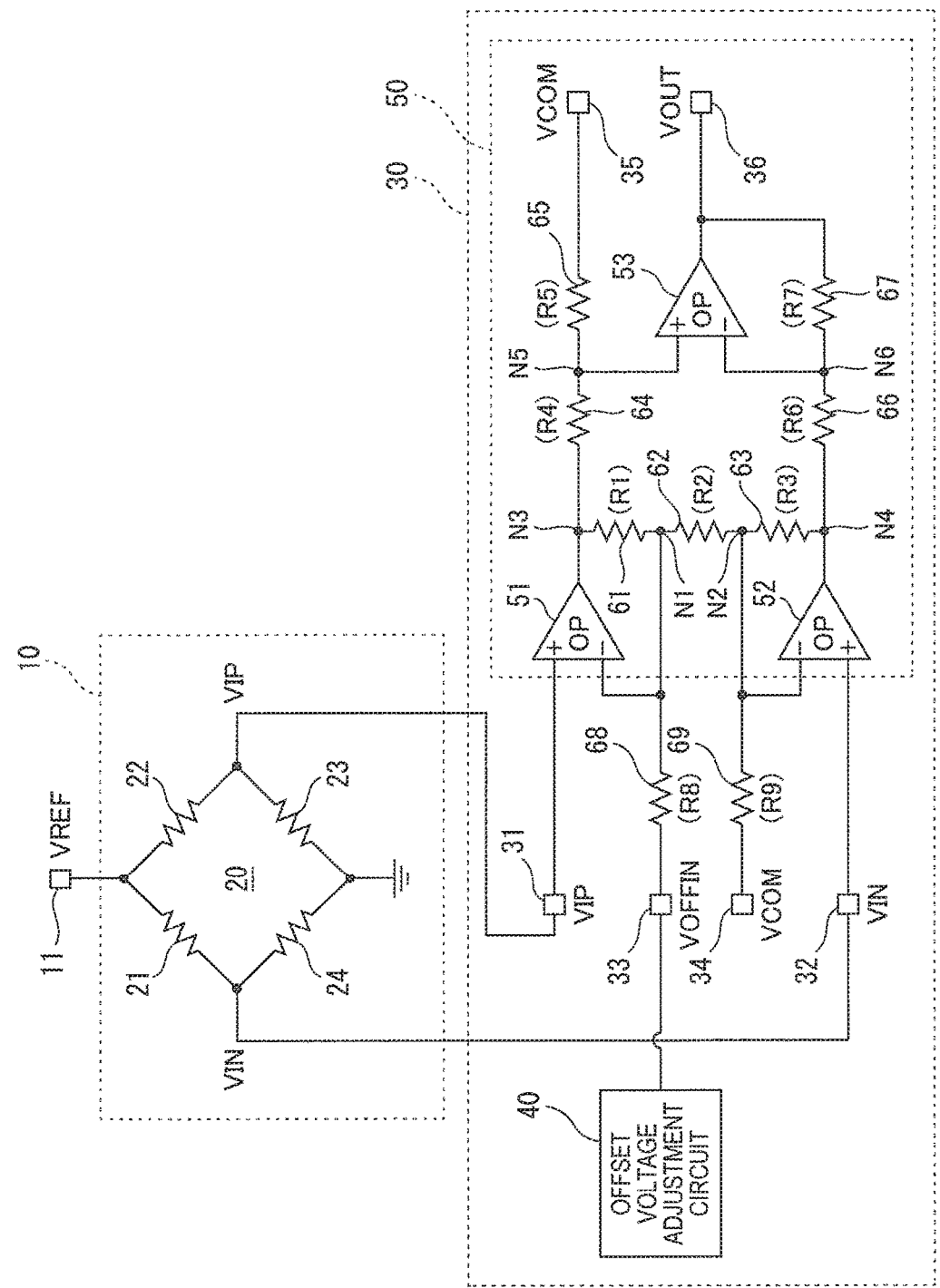
FIG. 1 is a circuit configuration view illustrative of an output amplifier circuit, in one technology, described in PLT 1, and the sensor device that uses the output amplifier circuit.
Figure 2:
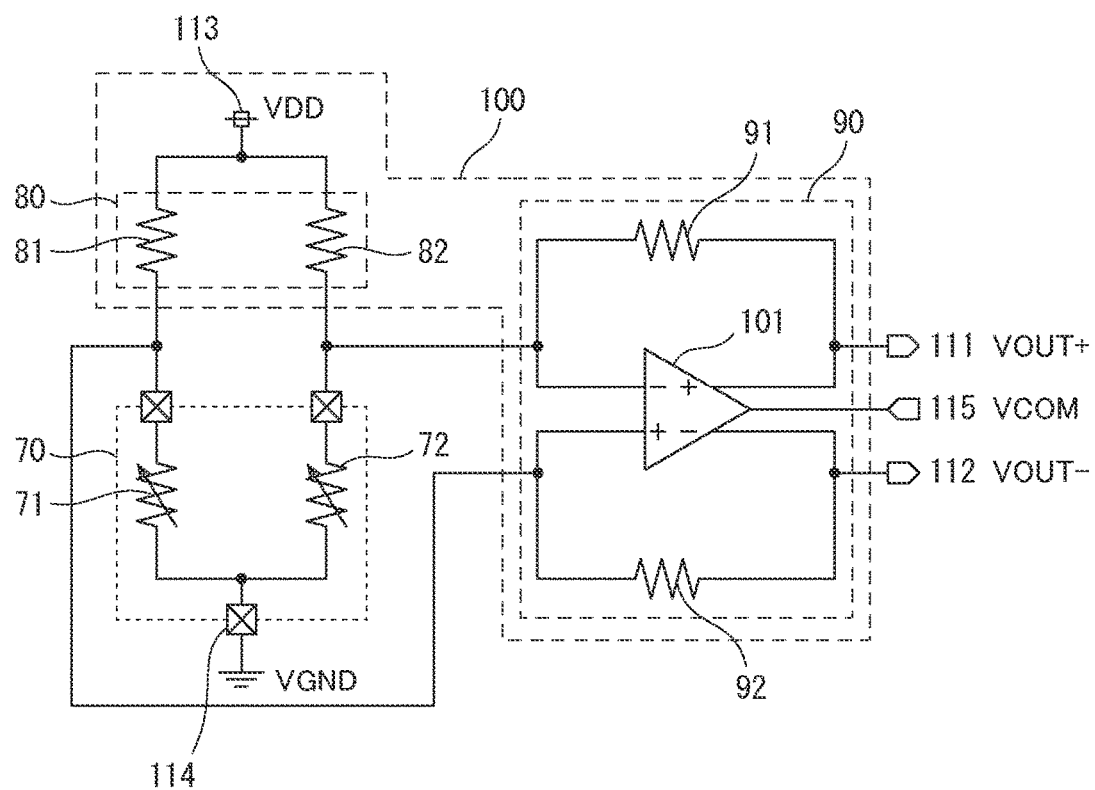
FIG. 2 is a circuit configuration view illustrative of an amplifier circuit in an embodiment 1 of the present disclosure.

FIG. 2 is a circuit configuration view illustrative of an amplifier circuit in an embodiment 1 of the present disclosure. In the drawing, a reference numeral 70 represents a converter, reference numerals 71 and 72 represent variable resistance sensors, a reference numeral 80 represents a bias unit, reference numerals 81 and 82 represent bias resistances, a reference numeral 90 represents an operational amplifier unit, reference numerals 91 and 92 represent feedback resistances, a reference numeral 100 represents an amplifier circuit, a reference numeral 101 represents a first operational amplifier, and reference numerals 111 to 115 represent terminals.

The amplifier circuit 100 in one embodiment of the present disclosure includes the converter 70 configured to convert a predefined physical quantity into a resistance value. The amplifier circuit 100 is configured to convert the resistance value converted by the converter 70 into a voltage value and then amplify the voltage.

The converter 70 includes a first variable resistance sensor 71 and a second variable resistance sensor 72. The variable resistance sensors 71 and 72 are piezoresistance elements, in one embodiment of the present disclosure. Also, the variable resistance sensors 71 and 72 have a common connection point where one ends of the variable resistance sensors 71 and 72 are connected to each other, and the common connection point is set at a predefined electric potential. For example, there are a configuration in which the common connection point is set at the reference voltage or power supply voltage (i.e., VDD), a configuration in which the common connection point is connected to the ground (i.e., VGND), a configuration in which the voltage is controlled by a voltage control circuit, and the like. The above configurations are also applicable to each of the embodiments (i.e., embodiments 2 to 7) to be described later.

In addition, the bias unit 80 is configured to determine a bias current of the converter 70, and includes the bias resistances 81 and 82, which are first and second bias elements 81 and 82, respectively.

Further, the operational amplifier unit 90 receives output signals from the bias unit 80 and the converter 70, as input signals. Specifically, the current output from the converter 70 is converted into a voltage, and then the voltage is output. Moreover, the operational amplification unit 90 includes the first operational amplifier 101, and feedback resistances 91 and 92 connected to input and output ends of the first operational amplifier 101. The first operational amplifier 101 is a whole differential operational amplifier having a common mode feedback circuit.

In other words, the amplifier circuit 100 in the embodiment 1 of the present disclosure is an amplifier circuit in which the variable resistance sensors 71 and 72 are connected to the VGND side, and includes the bias resistances 81 and 82 as elements configured to determine the bias currents of the variable resistance sensors 71 and 72, respectively. Furthermore, the resistances 91 and 92 are feedback resistances configured to determine the amplification degree of the signal. As the signals of the variable resistance sensors 71 and 72 are small, for example, the resistance values of the resistances 91 and 92 are set to several ten times the resistance values of the variable resistance sensors 71 and 72, respectively.

Next, operations of the amplifier circuit in the embodiment 1 of the present disclosure will be described.

RS is a resistance value when there is no input of the variable resistance sensors 71 and 72, RB is a resistance value of the bias resistances 81 and 82, and RF is a resistance value of the feedback resistances 91 and 92. In addition, VCOM is a common-mode voltage value of the output terminal 115 set by the common-mode feedback circuit 101 of the whole differential operational amplifier. Further, IS is a value of the current flowing across each of the variable resistance sensors 71 and 72. In this situation, the current value IS is represented in expression (1) below.

(Equation 1)

$$IS = \frac{RF \times (VDD - VGND) + RB \times (CVOM - VGND)}{RB \times RF + RF \times RS + RB \times RS} \qquad (1)$$

Here, RF is set to a value of several ten times RS. If RF has a resistance value of several ten times the resistance value of RS or RB, the expression (1) can be approximated to expression (2) below.

(Expression 2)

$$IS \cong \frac{(VDD - VGND)}{(RB + RS)} \qquad (2)$$

From the expression (2), since RS is a value determined by a sensor, it is to be understood that the value of the current to be flowing across the sensor can be set by the voltage VDD of the terminal 113, the voltage VGND of the terminal 114, and the resistance value RB of the bias resistances 81 and 82.

Also, it is assumed that VOUT+ and VOUT− are output voltages of the output terminals 111 and 112, respectively, and VOUT is an output voltage of a difference between VOUT+ and VOUT−, in a case where +ΔR is a resistance change quantity when there is an input to the variable resistance sensor 71 and −ΔR is a resistance change quantity when there is an input to the variable resistance sensor 72, expression (3) below represents such a relationship.

(Expression 3)

$$VOUT = \\ 2 \times \Delta R \times \frac{RF}{RS} \times \frac{RF \times (VDD - VGND) + RB \times (VCOM - VGND)}{(RB \times RF + RF \times RS + RB \times RS) - \frac{RB + RF}{RS} \times \Delta R^2} \qquad (3)$$

Here, when RF is set to a value of several ten times the resistance value of RS and ΔR takes a minute value, the expression (3) can be approximated to expression (4) below.

(Expression 4)

$$VOUT \cong 2 \times \Delta R \times \frac{RF}{RS} \times \frac{(VDD - VGND)}{(RB + RS)} \quad (4)$$

From the expression (4), the amplification degree can be determined by setting how many times the resistance value RF of the feedback resistances 91 and 92 is higher than the resistance value RS of the variable resistance sensors 71 and 72.

As described above, according to the amplifier circuit 100 in the embodiment 1 of the present disclosure, it is possible to amplify the resistance change quantities ±ΔR when there is an input to the variable resistance sensors 71 and 72 and to output as the voltages, by use of a simple circuit configuration.

As described above, according to the embodiment 1 of the present disclosure, it is possible to convert the resistance change quantity of the variable resistance sensor into a voltage signal and amplify the signal in a simple circuit configuration, and in addition, it is possible to reduce the noise components. Hence, an amplifier circuit with a high SN ratio, a low noise, and a small area, as a whole, is made available.

Specifically, in the embodiment 1 of the present disclosure, the current output from the variable resistance sensor is subject to I-V conversion, and one set of transistors are arranged at the input part in the initial stage of the sensor signal that affects the noise components. However, two sets of transistors are arranged at the input part, in the configuration of using the instrumentation amplifier for amplifying the output voltage of the variable resistance sensor, in one technology. Therefore, as compared with the configuration in one technology, it is possible to reduce the noise components in the embodiment 1 of the present disclosure. At the same time, it is also possible to reduce the circuit area or power consumption having a trade-off relationship with the noise.

(Embodiment 2)

Figure 3:
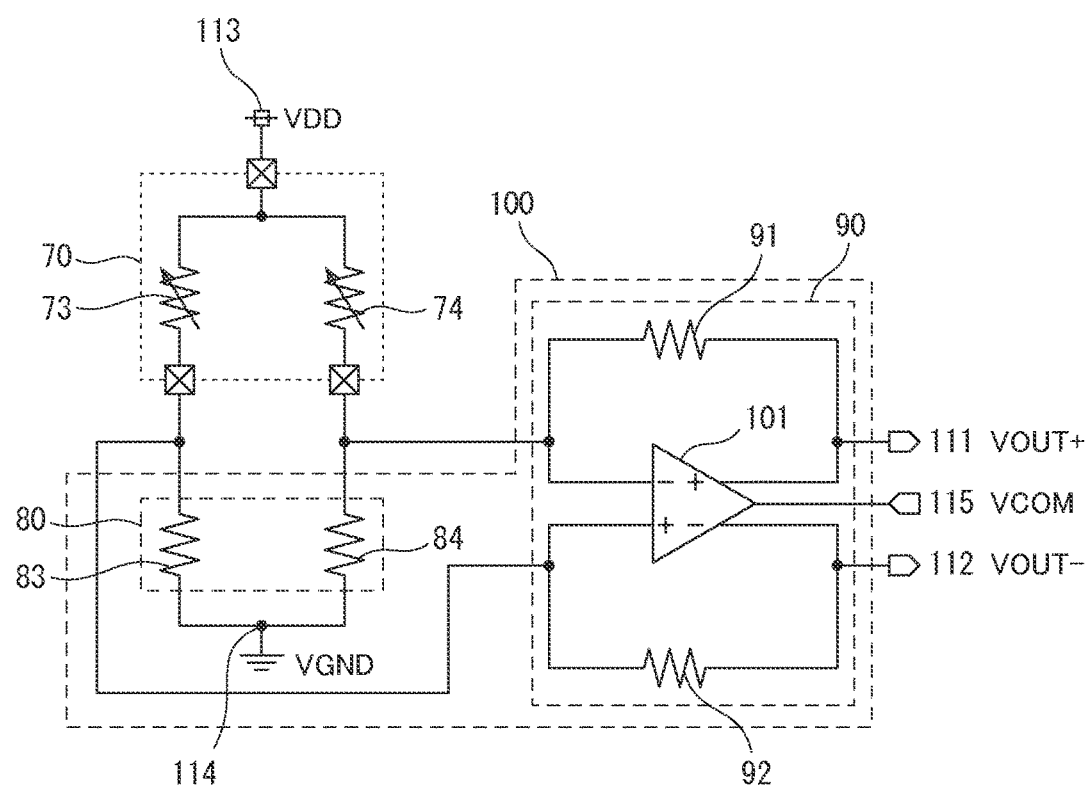
FIG. 3 is a circuit configuration view illustrative of an amplifier circuit in an embodiment 2 of the present disclosure.

FIG. 3 is a circuit configuration view illustrative of an amplifier circuit in an embodiment 2 of the present disclosure. In the drawing, reference numerals 73 and 74 represent variable resistance sensors, and reference numerals 83 and 84 represent bias resistances. In addition, identical reference numerals are applied to component elements having the same functions as those in FIG. 2.

The amplifier circuit 100 in the embodiment 2 of the present disclosure is an amplifier circuit in which the variable resistance sensors 73 and 74 are connected to the VDD side of the terminal 113.

The bias unit 80 includes the bias resistances 83 and 84 configured to determine bias currents of the first and second variable resistance sensors 73 and 74, respectively. It is to be noted that the first operational amplifier 101 is a whole differential operational amplifier having a common-mode feedback circuit, similarly to FIG. 2.

In other words, the amplifier circuit 100 in the embodiment 2 of the present disclosure is an amplifier circuit in which the variable resistance sensors 73 and 74 are connected to the VDD side of the terminal 113, and includes the first and second bias elements 83 and 84 as elements configured to determine the bias currents of the variable resistance sensors 73 and 74, respectively. Also, resistances 91 and 92 are feedback resistances configured to determine the amplification degree of the signal. Since signals of the variable resistance sensors 73 and 74 are small, for example, the resistance values are set to several ten times the resistance values of the variable resistance sensors 73 and 74.

Next, operations of the amplifier circuit in the embodiment 2 of the present disclosure will be described.

RS is a resistance value when there is no input of the variable resistance sensors 73 and 74, RB is a resistance value of the bias resistances 83 and 84, and RF is a resistance value of the feedback resistances 91 and 92. In addition, VCOM is a common-mode voltage value of the output set by the common-mode feedback circuit 101 of the whole differential operational amplifier. Further, IS is a value of the current flown across each of the variable resistance sensors 73 and 74. In this situation, IS is represented in expression (5) below.

(Expression 5)

$$IS = \frac{RF \times (VDD - VGND) + RB \times (VDD - VCOM)}{RB \times RF + RF \times RS + RB \times RS} \quad (5)$$

Here, RF is set to a value of several ten times the resistance value of RS. If RF has a resistance value of several ten times the resistance value of RS or RB, the expression (5) can be approximated to expression (6) below.

(Expression 6)

$$IS \cong \frac{(VDD - VGND)}{(RB + RS)} \quad (6)$$

From the expression (6), since RS is a value determined by a sensor, it is to be understood that the value of the current to be flown across the sensor can be set by the voltage VDD of the terminal 113, the voltage VGND of the terminal 114, and the resistance value RB of the bias resistances 83 and 84.

Also, it is assumed that VOUT+ and VOUT− are output voltages of the output terminals 111 and 112, respectively, and VOUT is an output voltage of a difference between VOUT+ and VOUT−, in a case where −ΔR is a resistance change quantity when there is an input to the variable resistance sensor 73 and +ΔR is a resistance change quantity when there is an input to the variable resistance sensor 74, expression (7) below represents such a relationship.

(Expression 7)

$$VOUT = 2 \times \Delta R \times \frac{RF}{RS} \times \frac{RF \times (VDD - VGND) + RB \times (VDD - VCOM)}{(RB \times RF + RF \times RS + RB \times RS) - \frac{RB + RF}{RS} \times \Delta R^2} \quad (7)$$

Here, when RF is set to a value of several ten times RS and ΔR takes a minute value, the expression (7) can be approximated to expression (8) below.

(Expression 8)

$$VOUT \cong 2 \times \Delta R \times \frac{RF}{RS} \times \frac{(VDD - VGND)}{(RB + RS)} \quad (8)$$

From the expression (8), the amplification degree can be determined by setting how many times the resistance value RF of the feedback resistances 91 and 92 is higher than the resistance value RS of the variable resistance sensors 73 and 74.

As described above, according to the amplifier circuit 100 in the embodiment 2 of the present disclosure, it is possible to amplify the resistance change quantities ±ΔR when there is an input to the variable resistance sensors 73 and 74, by use of a simple circuit configuration, and to output as the voltages.

As described above, according to the embodiment 2 of the present disclosure, it is possible to convert the resistance change quantity of the variable resistance sensor into a voltage signal and then amplify the signal in a simple circuit configuration, and in addition, it is possible to reduce the noise components. Hence, an amplifier circuit with a high SN ratio, a low noise, and a small area, as a whole, is made available.

Specifically, in the embodiment 2 of the present disclosure, the current output from the variable resistance sensor is subject to I-V conversion, and one set of transistors are arranged at the input part in the initial stage of the sensor signal that affects the noise components. However, two sets of transistors are arranged at the input part, in the configuration of using the instrumentation amplifier configured to amplify the output voltage of the variable resistance sensor, in one technology. Therefore, as compared with the configuration in one technology, it is possible to reduce the noise components in the embodiment 1 of the present disclosure. At the same time, it is possible to reduce the circuit area or power consumption having a trade-off relationship with the noise.

(Embodiment 3)

Figure 4:
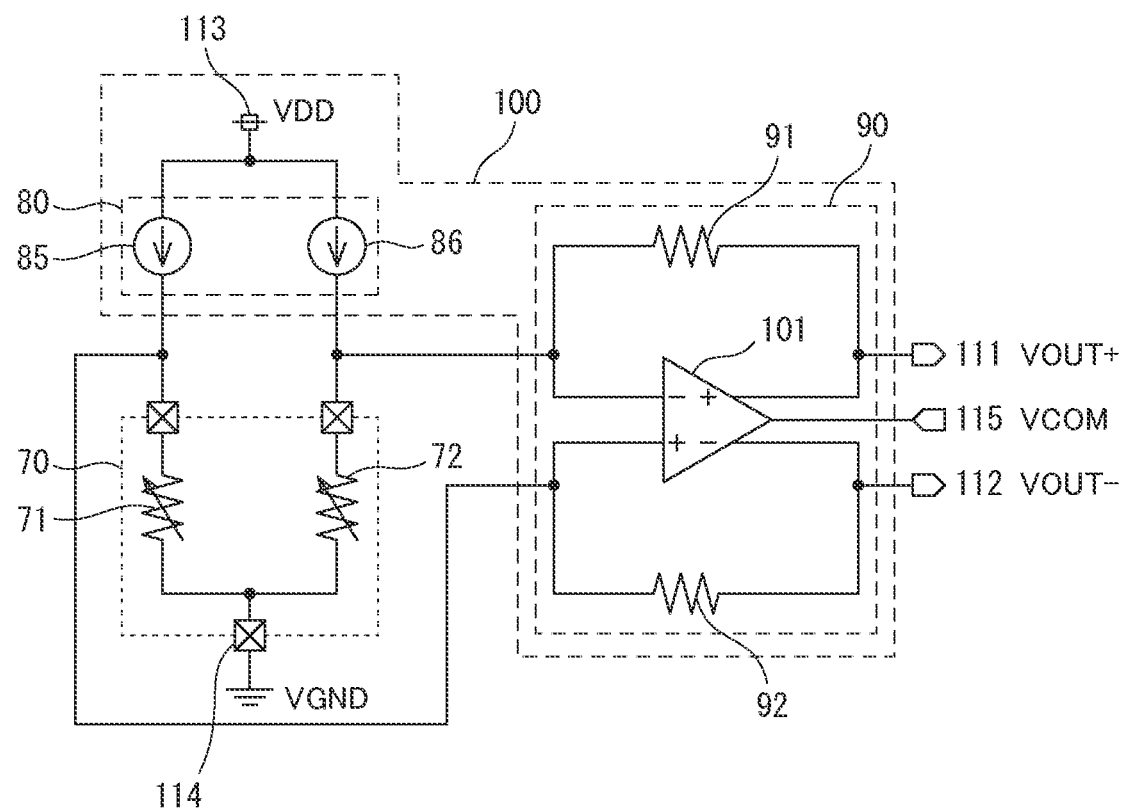
FIG. 4 is a circuit configuration view illustrative of an amplifier circuit in an embodiment 3 of the present disclosure.

FIG. 4 is a circuit configuration view illustrative of an amplifier circuit in an embodiment 3 of the present disclosure. In the drawing, reference numerals 85 and 86 represent first current sources. It is to be noted that identical reference numerals are applied to component elements having the same functions as those in FIG. 2.

The amplifier circuit 100 in the embodiment 3 of the present disclosure is an amplifier circuit in which the bias resistances 81 and 82 in FIG. 2 are replaced with the first current sources 85 and 86, respectively.

The bias unit 80 includes the first current sources 85 and 86, in other words, the first and second bias elements 85 and 86 configured to determine the bias currents of the first and second variable resistance sensors 71 and 72, respectively.

The operational amplifier unit 90 includes the first operational amplifier 101 configured to receive each of the output signals from the first and second variable resistance sensors 71 and 72, as an input signal. It is to be noted that the first operational amplifier 101 is a whole differential operational amplifier having a common-mode feedback circuit.

That is to say, the amplifier circuit 100 in the embodiment 3 of the present disclosure is an amplifier circuit in which the variable resistance sensors 71 and 72 are connected to the VGND side of the terminal 114, and includes the first current sources 85 and 86 as elements configured to determine the bias currents of the variable resistance sensors 71 and 72, respectively. In addition, the resistances 91 and 92 are feedback resistances configured to determine the amplification degree of the signal. Since signals of the variable resistance sensors 71 and 72 are small, for example, the resistance values are set to several ten times the variable resistance sensors 71 and 72.

Next, operations of the amplifier circuit in the embodiment 3 of the present disclosure will be described.

RS is a resistance value when there is no input of the variable resistance sensors 71 and 72, IB is a current value of the first current sources 85 and 86, and RF is a resistance value of the feedback resistances 91 and 92. In addition, VCOM is a common-mode voltage value of the output set by the common-mode feedback circuit 101 of the whole differential operational amplifier. Further, IS is a value of the current flown across each of the variable resistance sensors 71 and 72. In this situation, IS is represented in expression (9) below.

(Expression 9)

$$IS = \frac{RF \times IB + (VCOM - VGND)}{RF + RS} \quad (9)$$

Here, RF is set to a value of several ten times the resistance value of RS. If RF has a resistance value of several ten times the resistance value of RS, the expression (9) can be approximated to expression (10) below.
(Expression 10)

$$IS \cong IB \quad (10)$$

From the expression (10), it is to be understood that the value of the current to be flown across the sensor can be set by the current value IB of the first current sources 85 and 86.

Also, it is assumed that VOUT+ and VOUT− are output voltages of the output terminals 111 and 112, respectively, and VOUT is an output voltage of a difference between VOUT+ and VOUT−, in a case where +ΔR is a resistance change quantity when there is an input to the variable resistance sensor 71 and −ΔR is a resistance change quantity when there is an input to the variable resistance sensor 72, expression (11) below represents such a relationship.

(Expression 11)

$$VOUT = 2 \times \Delta R \times \frac{RF}{RS} \times \frac{RF \times IB + (VCOM - VGND)}{(RF + RS) - \frac{\Delta R^2}{RS}} \quad (11)$$

Here, when RF is set to a value of several ten times the resistance value of RS and ΔR takes a minute value, the expression (11) can be approximated to expression (12) below.

(Expression 12)

$$VOUT \cong 2 \times \Delta R \times \frac{RF}{RS} \times IB \quad (12)$$

From the expression (12), the amplification degree can be determined by setting how many times the resistance value RF of the feedback resistances 91 and 92 is higher than the resistance value RS of the variable resistance sensors 71 and 72.

As described above, according to the amplifier circuit 100 in the embodiment 3 of the present disclosure, it is possible to amplify the resistance change quantities ±ΔR when there is an input to the variable resistance sensors 71 and 72, by use of a simple circuit configuration, and to output as the voltages.

As described above, according to the embodiment 3 of the present disclosure, it is possible to convert the resistance change quantity of the variable resistance sensor into a voltage signal and amplify the signal in a simple circuit configuration, and in addition, it is possible to reduce the noise components. Hence, an amplifier circuit with a high SN ratio, a low noise, and a small area, as a whole, is made available.

Specifically, in the embodiment 1 of the present disclosure, the current output from the variable resistance sensor is subject to I-V conversion, and one set of transistors are arranged at the input part in the initial stage of the sensor signal that affects the noise components. However, two sets of transistors are arranged at the input part, in the configuration of using the instrumentation amplifier configured to amplify the output voltage of the variable resistance sensor, in one technology. Therefore, as compared with the configuration in one technology, it is possible to reduce the noise components in the embodiment 3 of the present disclosure. At the same time, it is also possible to reduce the circuit area or power consumption having a trade-off relationship with the noise.

(Embodiment 4)

Figure 5:
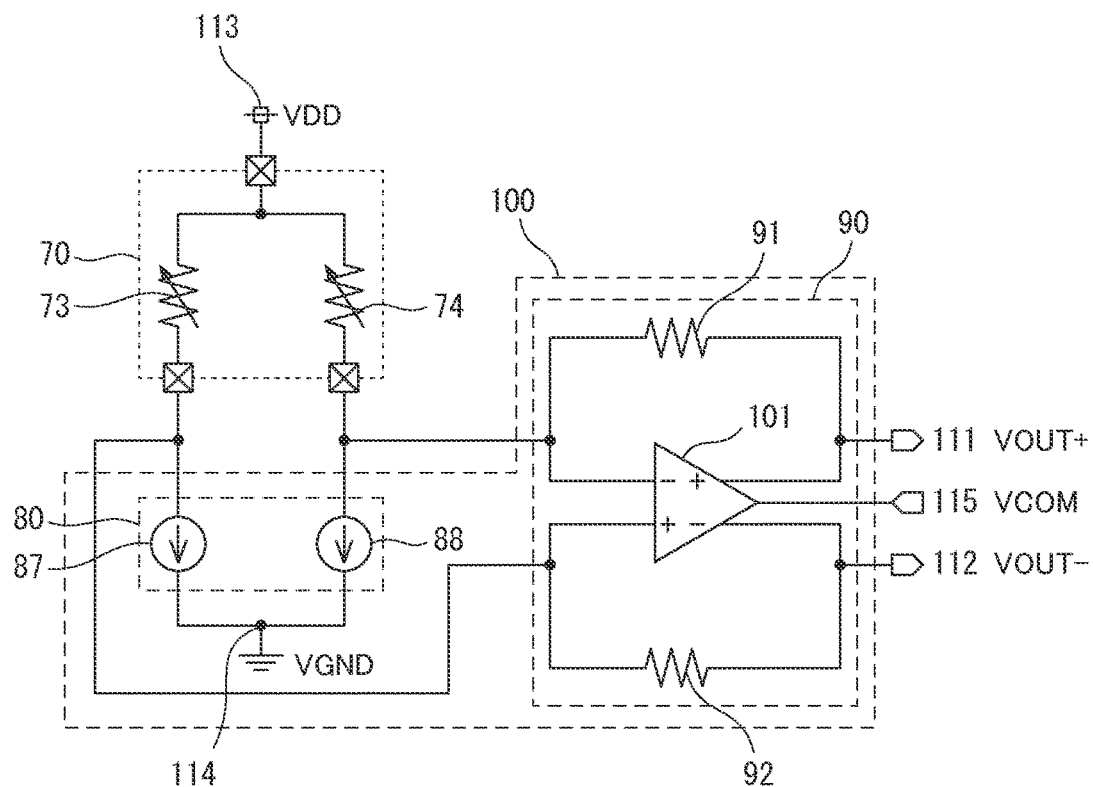
FIG. 5 is a circuit configuration view illustrative of an amplifier circuit in an embodiment 4 of the present disclosure.

FIG. 5 is a circuit configuration view illustrative of an amplifier circuit in an embodiment 4 of the present disclosure. In the drawing, reference numerals 87 and 88 represent second current sources. It is to be noted that identical reference numerals are applied to component elements having the same functions as those in FIG. 3.

The amplifier circuit 100 in the embodiment 4 of the present disclosure is an amplifier circuit in which the bias resistances 83 and 84 in FIG. 3 are replaced with the second current sources 87 and 88, respectively, and the variable resistance sensor is connected to the VDD side of the terminal 113.

In addition, the operational amplifier unit 90 includes the first operational amplifier 101 configured to receive each of the output signals of the first and second variable resistance sensors 73 and 74, as an input signal. The first operational amplifier 101 is a whole differential operational amplifier having a common-mode feedback circuit.

In other words, the amplifier circuit 100 in the embodiment 4 of the present disclosure is an amplifier circuit in which the variable resistance sensors 73 and 74 are connected to the VDD side of the terminal 113, and includes the second current sources 87 and 88 as elements configured to determine the bias currents of the variable resistance sensors 73 and 74, respectively. Also, the resistances 91 and 92 are feedback resistances configured to determine the amplification degree of the signal. Since signals of the variable resistance sensors 73 and 74 are small, for example, the resistance values are set to several ten times the variable resistance sensors 73 and 74.

Next, operations of the amplifier circuit in the embodiment 4 of the present disclosure will be described.

RS is a resistance value when there is no input of the variable resistance sensors 73 and 74, IB is a current value of the second current sources 87 and 88, and RF is a resistance value of the feedback resistances 91 and 92. In addition, VCOM is a common-mode voltage value of the output set by the common-mode feedback circuit 101 of the whole differential operational amplifier. Further, IS is a value of the current flown across each of the variable resistance sensors 73 and 74. In this situation, IS is represented in expression (13) below.

(Expression 13)

$$IS = \frac{RF \times IB + (VDD - VCOM)}{RF + RS} \quad (13)$$

Here, RF is set to a value of several ten times the resistance value of RS. If RF has a resistance value of several ten times the resistance value of RS, the expression (13) can be approximated to expression (14) below.

(Expression 14)

$$IS \cong IB \quad (14)$$

From the expression (14), it is understood that the current value IB of the second current sources 87 and 88 enables setting of the value of the current to be flown across the sensor.

Also, it is assumed that VOUT+ and VOUT− are output voltages of the output terminals 111 and 112, respectively, and VOUT is an output voltage of a difference between VOUT+ and VOUT−, in a case where −ΔR is a resistance change quantity when there is an input to the variable resistance sensor 73 and +ΔR is a resistance change quantity when there is an input to the variable resistance sensor 74, expression (15) below represents such a relationship.

(Expression 15)

$$VOUT = 2 \times \Delta R \times \frac{RF}{RS} \times \frac{RF \times IB + (VDD - VCOM)}{(RF + RS) - \frac{\Delta R^2}{RS}} \quad (15)$$

Here, when RF is set to a value of several ten times the resistance value of RS and ΔR takes a minute value, the expression (15) can be approximated to expression (16) below.

(Expression 16)

$$VOUT \cong 2 \times \Delta R \times \frac{RF}{RS} \times IB \quad (16)$$

From the expression (16), the amplification degree can be determined by setting how many times the resistance value RF of the resistances 91 and 92 is higher than the resistance value RS of the variable resistance sensors 73 and 74.

As described above, according to the amplifier circuit 100 in the embodiment 4 of the present disclosure, it is possible to amplify the resistance change quantities ±ΔR when there is an input to the variable resistance sensors 73 and 74, by use of a simple circuit configuration, and to output as the voltages.

As described above, according to the embodiment 4 of the present disclosure, it is possible to convert the resistance change quantity of the variable resistance sensor into a voltage signal and then amplify the signal in a simple circuit configuration, and in addition, it is possible to reduce the noise components. Hence, an amplifier circuit with a high SN ratio, a low noise, and a small area, as a whole, is made available.

Specifically, in the embodiment 4 of the present disclosure, the current output from the variable resistance sensor is subject to I-V conversion, and one set of transistors are arranged at the input part in the initial stage of the sensor signal that affects the noise components. However, two sets of transistors are arranged at the input part, in the configuration of using the instrumentation amplifier configured to amplify the output voltage of the variable resistance sensor, in one technology. Therefore, as compared with the configuration in one technology, it is possible to reduce the noise components in the embodiment 4 of the present disclosure. At the same time, it is also possible to reduce the circuit area or power consumption having a trade-off relationship with the noise.

(Embodiment 5)

Figure 6:
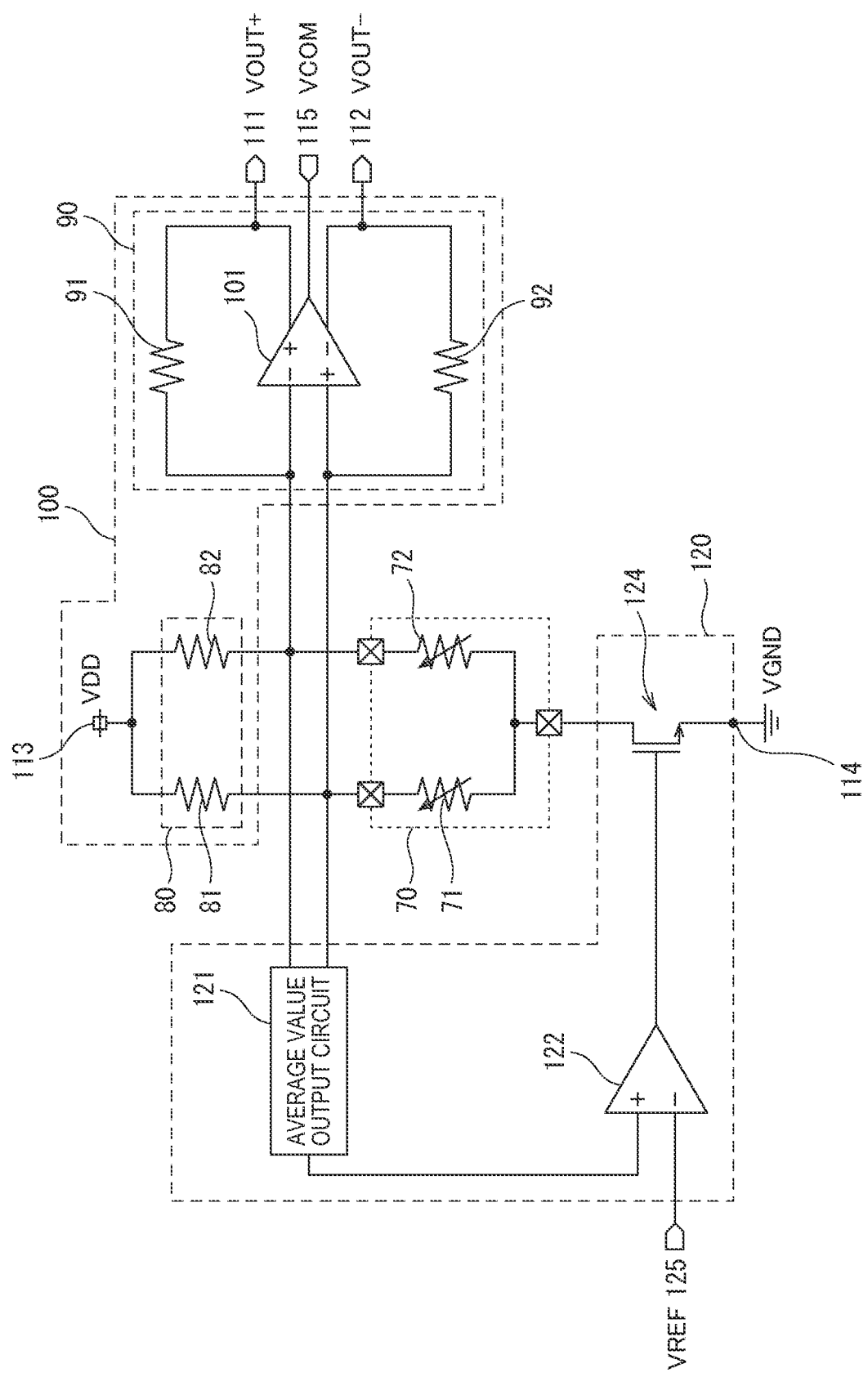
FIG. 6 is a circuit configuration view illustrative of an amplifier circuit in an embodiment 5 of the present disclosure.

FIG. 6 is a circuit configuration view illustrative of an amplifier circuit in an embodiment 5 of the present disclosure. In the drawing, a reference numeral 120 represents a first voltage control circuit, a reference numeral 121 represents an average value output circuit, a reference numeral 122 represents a third operational amplifier, and a reference numeral 124 represents a third current source. It is to be noted that identical reference numerals are applied to component elements having the same functions as those in FIG. 2.

The amplifier circuit 100 in the embodiment 5 of the present disclosure includes a first voltage control circuit 120 configured to control the voltage of a connection point where one ends of the variable resistance sensor 71 and 72 are connected to each other, based on output signals from the variable resistance sensors 71 and 72. The first voltage control circuit 120 is configured to control the voltage of the above-described connection point so that the average value between the voltage at a node of one end of the first variable resistance sensor and the voltage at a node of one end of the second variable resistance sensor is a predefined reference voltage. The amplifier circuit in the embodiment 5 of the present disclosure is an amplifier circuit in which the first voltage control circuit 120 is added to the amplifier circuit in the above-described embodiment 1 of the present disclosure.

In addition, the first voltage control circuit 120 includes an average value output circuit 121 configured to output the average value of input voltages of the whole differential operational amplifier 101, a third current source 124 connected to a connection point where the one ends of the first variable resistance sensor and the second variable resistance sensor are connected to each other, and a first current control circuit 122 configured to control the current of the third current source 124.

To be specific, the third current source is a first transistor having a drain connected to the above-described connection point, and a gate voltage control circuit 122, which is a current control circuit, controls a gate voltage of the first transistor 124. The current control circuit is an operational amplifier 122, and receives an output signal from the average value output circuit 121 and a predefined reference voltage VREF, as inputs.

It is to be noted that the same configuration is applicable in the embodiment 2 illustrated in FIG. 3. In other words, the first voltage control circuit 120 can be also configured to include a third current source 124 connected to the connection point where one ends of the first variable resistance sensor and the second variable resistance sensor are connected to each other, and a current control circuit 122 configured to control the current of the third current source 124.

Also, the amplifier circuit in the embodiment 5 of the present disclosure is an amplifier circuit, in which a circuit configured to reduce a change in the sensitivity caused by a temperature property or a production variation of the variable resistance sensors and the resistances (i.e., a change in the amplification degree of the output voltage with respect to the same sensor input) is added.

The average value output circuit 121 is configured with a circuit configured to output the average value of the input voltages of the whole differential operational amplifier 101. The third current source 124 is configured with an NMOS transistor.

The third current source 124 is connected to the connection point of the variable resistance sensors 71 and 72.

It is to be noted that when the current source 124 is connected to the connection point of the bias resistances 81 and 82 and the connection point of the variable resistance sensors 71 and 72 is assumed to have a fixed voltage, an effect of reducing a change in the sensitivity caused by the temperature property or the production variation of the variable resistance sensors and the resistances is not obtainable.

In addition, the amplifier circuit 100 in the embodiment 5 of the present disclosure is an amplifier circuit, in which a circuit configured to control the average value of the input voltages of the whole differential operational amplifier 101 to be equal to the voltage value of VREF is added to the amplifier circuit in the embodiment 1 of the present disclosure. The output from the average value output circuit 121 to be the input voltages to the whole differential operational amplifier 101 and VREF of the terminal 125 are virtually short-circuited by the operational amplifier 122, so that an input voltage to the whole differential operational amplifier 101 is controlled to be equal to VREF.

Next, operations of the amplifier circuit in the embodiment 5 of the present disclosure will be described.

It is assumed that RS is a resistance value when there is no input of the variable resistance sensors 71 and 72, RB is a resistance value of the bias resistances 81 and 82, and RF is a resistance value of the feedback resistances 91 and 92. In addition, VCOM is a common-mode voltage value of the output set by the common-mode feedback circuit 101 of the whole differential operational amplifier. Further, it is assumed that IS is a value of the current flown across each of the variable resistance sensors 71 and 72. In this situation, IS is represented in expression (17) below.

(Expression 17)

$$IS = \frac{VDD - VREF}{RB} + \frac{VCOM - VREF}{RF} \qquad (17)$$

In this situation, when the voltage values of VREF and VCOM are set to be equal, expression (18) is obtained.

(Expression 18)

$$IS = \frac{VDD - VREF}{RB} \qquad (18)$$

From the expression (18), it is understood that the voltage VDD of the terminal 113, the voltage VREF of the terminal 125, and the resistance value RB of the bias resistances 81 and 82 enable setting of the value of the currents to be flown across the variable resistance sensors 71 and 72.

Also, it is assumed that VOUT+ and VOUT− are output voltages of the output terminals 111 and 112, respectively, and VOUT is an output voltage of a difference between VOUT+ and VOUT−, in a case where +ΔR is a resistance change quantity when there is an input to the variable resistance sensor 71 and −ΔR is a resistance change quantity when there is an input to the variable resistance sensor 72, expression (19) below represents such a relationship.

(Expression 19)

$$VOUT = 2 \times \Delta R \times \frac{RF}{RS} \times \left( \frac{VDD - VREF}{RB} + \frac{VCOM - VREF}{RF} \right) \quad (19)$$

In this situation, when the voltage values of VREF and VCOM are set to be equal, expression (20) is obtained.

(Expression 20)

$$VOUT = 2 \times \Delta R \times \frac{RF}{RS} \times \left( \frac{VDD - VREF}{RB} \right) \quad (20)$$

From the expression (20), the amplification degree can be determined by setting how many times the resistance value RF of the feedback resistances 91 and 92 is higher than the resistance value RS of the variable resistance sensors 71 and 72.

An effect of reducing the change in the sensitivity caused by the temperature property or the production variation of the variable resistance sensors and the resistances will be described below.

From the above-described expression (20), if there is a correlation in the temperature property or the production variation between the resistance value RS when there is no input of the variable resistance sensors 71 and 72 and the resistance change quantities ±ΔR when there is an input of the variable resistance sensors 71 and 72, a change in the resistance caused by the temperature property or the production variation is cancelled in ΔR and RS of the denominator. In addition, when matching is made between the resistance value RB of the bias resistances 81 and 82 the resistance value RF of the feedback resistances 91 and 92, a change in the resistance caused by the temperature property or the production variation is cancelled. Accordingly, it is possible to reduce a change in the sensitivity caused by the temperature property or the production variation of the variable resistance sensors or the resistances.

As described above, in the embodiment 5 of the present disclosure, a change in the sensitivity caused by the temperature property or the production variation of the variable resistance sensors, the bias resistances, or the feedback resistances can be reduced by making matching of the elements except the variable resistance sensors. This eliminates the necessity of a resistance made to match the production variation or the temperature property of the variable resistance sensors, and the production is enabled with ease.

To be specific, as compared with the above-described embodiment 1, it is made possible to suppress a variation in the sensitivity caused by the production variation or a sensitivity change caused by the temperature property of the variable resistance sensors or the resistances (i.e., bias resistances or feedback resistances) included in the amplifier circuit. In the embodiment 5 of the present disclosure, the amplifier circuit is configured such that the resistance value of the variable resistance sensor and a temperature change in the resistance value change of the variable resistance sensor are cancelled, the temperature change in the bias resistance and that of the feedback resistance are cancelled, and thus the temperature change is totally cancelled. The same reasoning applies to the production variation. It is to be noted that in the embodiment 5 of the present disclosure, the transistor 124 may be arranged in the operational amplifier 122.

(Embodiment 6)

Figure 7:
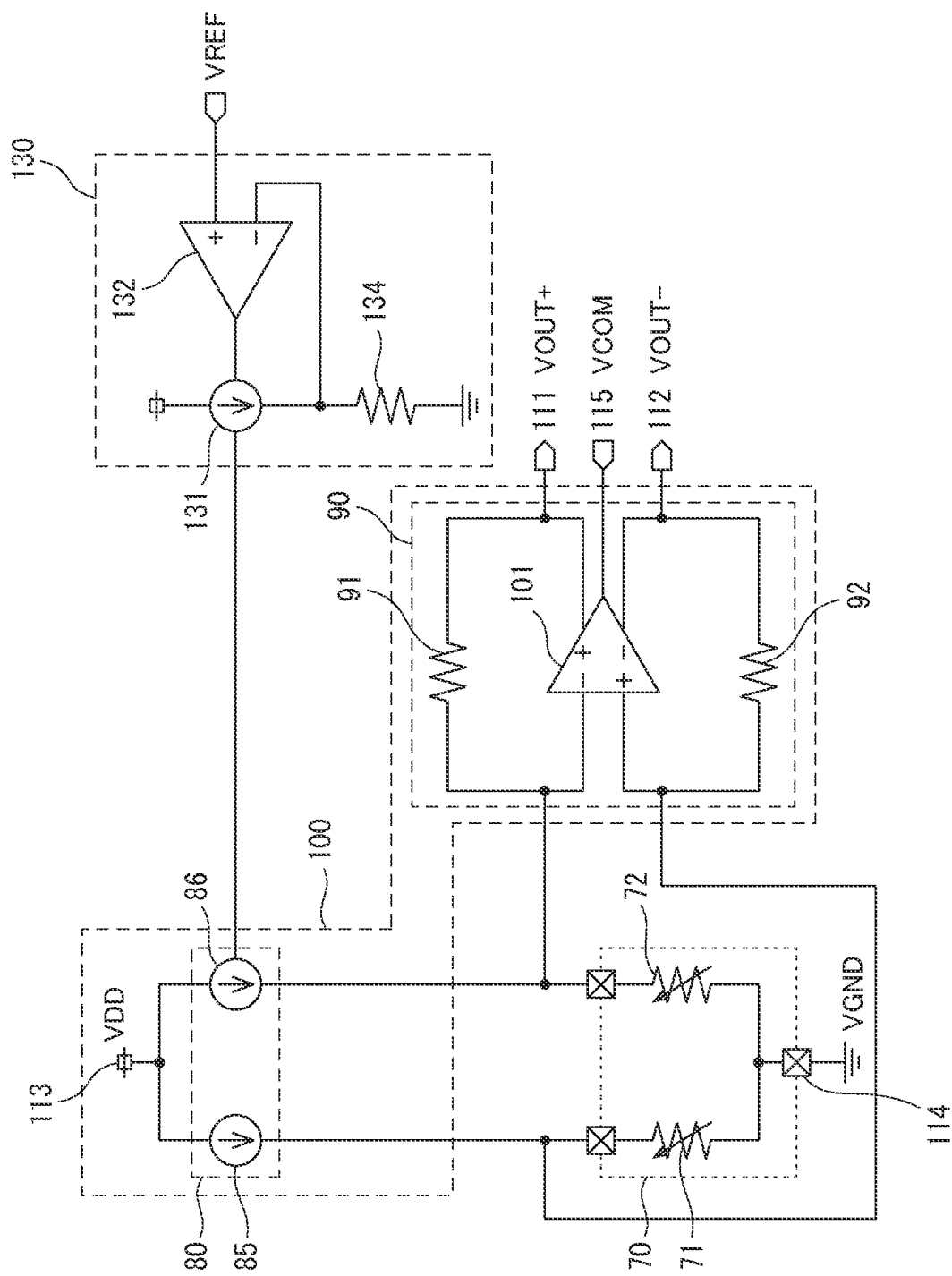
FIG. 7 is a circuit configuration view illustrative of an amplifier circuit in an embodiment 6 of the present disclosure.

FIG. 7 is a circuit configuration view illustrative of an amplifier circuit in an embodiment 6 of the present disclosure. A reference numeral 130 represents a second current control circuit, a reference numeral 131 represents a fourth current source, a reference numeral 132 represents a fourth operational amplifier, and a reference numeral 134 represents a reference resistance. It is to be noted that identical reference numerals are applied to component elements having the same functions as those in FIG. 4.

The amplifier circuit 100 in the embodiment 6 of the present disclosure includes the second current control circuit 130 configured to control a current value of the first current sources 85 and 86 included in the bias unit 80. The second current control circuit 130 includes the fourth current source 131 and the reference resistance 134, and generates a bias current of the bias unit 80 based on the reference resistance 134, so as to control the current values of the first current sources 85 and 86 to be values in inverse proportion to the resistance value of the reference resistance 134. In other words, the amplifier circuit in the embodiment 6 of the present disclosure is an amplifier circuit, in which the second current control circuit 130 is added to the amplifier circuit in the above-described embodiment 3 of the present disclosure.

It is to be noted that the second current control circuit 130 is also applicable to the amplifier circuit in the embodiment 4 illustrated in FIG. 5. In other words, it is possible to configure the amplifier circuit to include the second current control circuit 130 configured to control the current value of the second current sources 87 and 88 included in the bias unit 80.

Further, the amplifier circuit 100 in the embodiment 6 of present disclosure is an amplifier circuit, in which a circuit configured to reduce a change in the sensitivity caused by the temperature property or the production variation of the variable resistance sensors or the resistances (i.e., a change in the amplification degree of the output voltage with respect to the same sensor input) is added.

Moreover, the amplifier circuit 100 in the embodiment 6 of the present disclosure includes the resistance 134 as a reference resistance, and is an amplifier circuit in which a circuit configured to control the current values of the first current sources 85 and 86 of the amplifier circuit in the above-described embodiment 3 to be the values in reverse proportion to the resistance value of the reference resistance 134.

Next, a method of reducing a change in the sensitivity caused by the temperature property or the production variation of the variable resistance sensors or the resistances in the embodiment 6 of the present disclosure will be described.

RREF is a resistance value of the reference resistance 134, and IREF is a current value of the current source 131. Herein, by the fourth operational amplifier 132, the current value of the current source 131 is controlled as in expression (21) below.

(Expression 21)

$$IREF = \frac{VREF}{RREF} \quad (21)$$

In addition, the first current sources 85 and 86 are configured with a current mirror circuit of the fourth current source 131, so that the current values of the first current sources 85 and 86 are controlled to be a constant multiplication (i.e., α times) of the current value IREF of the fourth current source 131. Thus, the expression (12) becomes expression (22) below.

(Expression 22)

$$VOUT \cong 2 \times \Delta R \times \frac{RF}{RS} \times \alpha \frac{VREF}{RREF} \quad (22)$$

From the expression (22), if there is a correlation in the temperature property or the production variation between RS that is a resistance value when there is no input of the variable resistance sensors 71 and 72 and the resistance change quantities ±ΔR when there is an input, the change in the resistance caused by the temperature property or the production variation is cancelled in ΔR and RS of the denominator. Moreover, if the resistance value RREF of the resistance 134 and the resistance value RF of the feedback resistances 91 and 92 are matched with each other, the change in the resistance caused by the temperature property or the production variation is cancelled. Accordingly, a change in the sensitivity caused by the temperature property or the production variation of the variable resistance sensors or the resistances can be reduced.

As described above, according to the embodiment 6 of the present disclosure, a change in the sensitivity caused by the production variation or the temperature property of the variable resistance sensors, the bias resistances, and the feedback resistances can be reduced by matching of the elements except the variable resistance sensors. Thus, the production is enabled with ease without the necessity of the resistance made to match the production variation or the temperature property of the variable resistance sensors.

To be specific, as compared with the above-described embodiment 3, it is made possible to suppress a variation in the sensitivity caused by the production variation or a change in the sensitivity caused by the temperature property of the variable resistance sensors or the resistances (i.e., bias resistances or feedback resistances) included in the amplifier circuit. In the embodiment 6 of the present disclosure, the amplifier circuit is configured such that the resistance value of the variable resistance sensor and the temperature change in the resistance value change of the variable resistance sensor are cancelled, and the temperature changes in the bias resistance and the feedback resistance are cancelled, so that the temperature change is totally cancelled. The same reasoning applies to the production variation.

(Embodiment 7)

Figure 8:
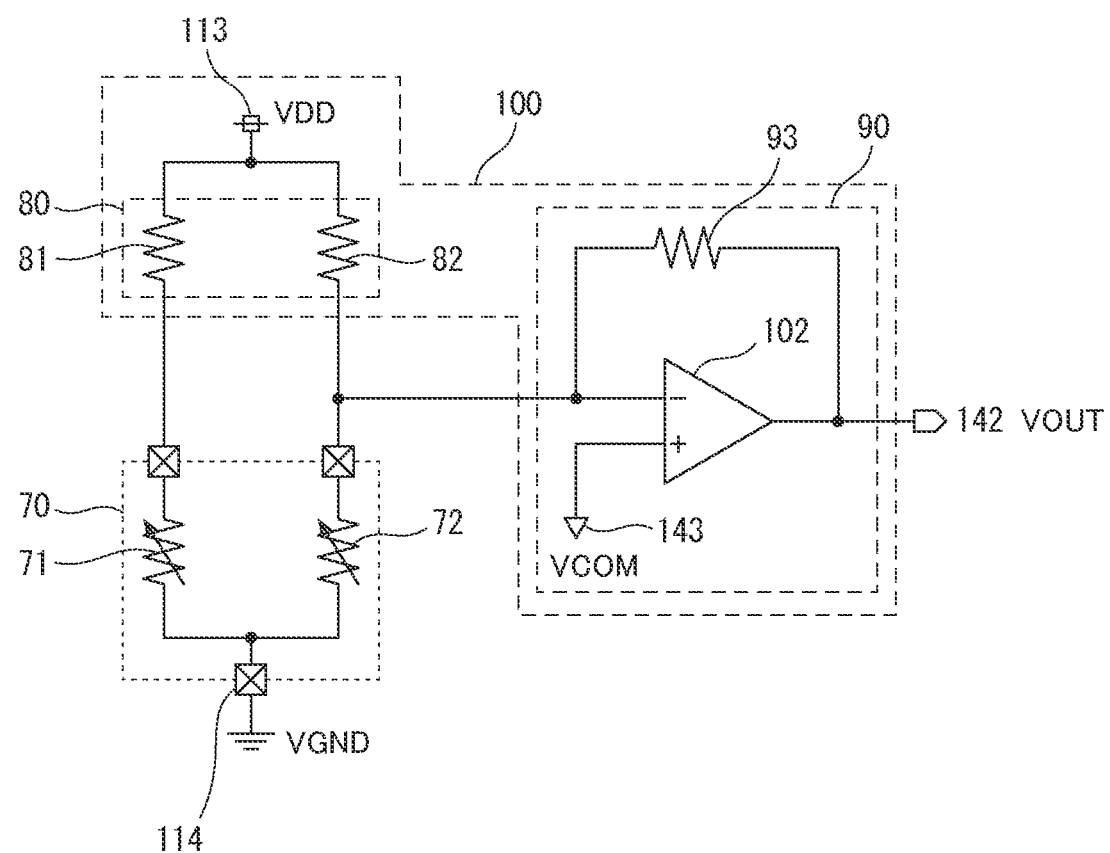
FIG. 8 is a circuit configuration view illustrative of an amplifier circuit in an embodiment 7 of the present disclosure.

FIG. 8 is a circuit configuration view illustrative of an amplifier circuit in an embodiment 7 of the present disclosure. In the drawing, a reference numeral 102 represents a second operational amplifier, and a reference numeral 93 represents the feedback resistance. It is to be noted that identical reference numerals are applied to component elements having the same functions as those in FIG. 2.

The amplifier circuit 100 in the embodiment 7 of the present disclosure has a single ended circuit configuration in which only one of the variable resistance sensors 71 and 72 is connected to the second operational amplifier 102.

It is to be noted that such a configuration is also applicable to the embodiment 2 illustrated in FIG. 3. That is to say, only one of the variable resistance sensors 73 and 74 can be connected to the second operational amplifier 102 to have a single ended circuit configuration.

In other words, the amplifier circuit 100 in the embodiment 7 of present disclosure is an amplifier circuit, in which the whole differential operational amplifier 101 in the above-described embodiment 1 of the present disclosure is replaced with the fourth operational amplifier 102, the feedback resistances 91 and 92 configured to determine the amplification degree are replaced with the feedback resistance 93, and an input terminal on one side of the whole differential operational amplifier 101 is connected to the second operational amplifier 102.

As described above, FIG. 8 is a circuit configuration view of the amplifier circuit in which the variable resistance sensor 72 side is connected to the second operational amplifier 102. Hereinafter, operations of the amplifier circuit in the embodiment 7 of present disclosure will be described by use of the amplifier circuit in which the variable resistance sensor 72 side is connected to the second operational amplifier 102.

RS is a resistance value when there is no input of the variable resistance sensors 71 and 72, RB is a resistance value of the bias resistances 81 and 82, and RF is a resistance value of the feedback resistance 93. In addition, IS is a value of the current flown across the variable resistance sensor 72. In this situation, IS is represented in expression (23) below.

(Expression 23)

$$IS = \frac{VCOM - VGND}{RS} \quad (23)$$

From the expression (23), it is understood that the voltage VCOM of the terminal 143 and the voltage VGND of the terminal 114 enable setting of the value of the current to be flown across the variable resistance sensor 72.

Also, in a case where VOUT is an output voltage of the output terminal 142 and +ΔR is a resistance change quantity when there is an input to the variable resistance sensor 72, expression (24) below represents such a relationship.

(Expression 24)

$$VOUT = -\frac{RF \times (VCOM - VGND)}{RS^2 - \Delta R^2} \Delta R + \quad (24)$$
$$RF\left\{\frac{RS \times (VCOM - VGND)}{RS^2 - \Delta R^2} - \frac{VDD - VCOM}{RB}\right\} + VCOM$$

Here, it is assumed that ΔR takes a minute value and RB is set to satisfy RB=(VDD−VCOM)/(VCOM−VGND)×RS, the expression (24) can be approximated to expression (25) below.

(Expression 25)

$$VOUT \cong -\frac{RF \times (VCOM - VGND)}{RS^2}\Delta R + VCOM \qquad (25)$$

From the expression (25), the amplification degree can be determined by setting how many times the resistance value RF of the feedback resistance 93 is higher than the resistance value RS of the variable resistance sensor 72.

Hence, in the amplifier circuit 100 in the embodiment 7 of present disclosure, when there is an input to the variable resistance sensor 72, even in the circuit in which the whole differential operational amplifier 101 in the above-described embodiment 1 of the present disclosure is replaced with the second operational amplifier 102, the feedback resistances 91 and 92 configured to determine the amplification degree are replaced with the feedback resistance 93, and an input terminal on one side of the whole differential operational amplifier 101 is connected to the second operational amplifier 102, such resistance change quantities ±ΔR can be amplified by using a simple circuit configuration and then output as the voltages. The same reasoning also applies to the case where a terminal of the variable resistance sensor 71 side is connected to the second operational amplifier 102. Additionally, the same effect is achievable without the variable resistance sensor 71 that is not connected to the bias resistance 81.

Piezoresistance elements are examples of the variable resistance sensors in each of the above-described embodiments. In addition, in each of the above-described embodiments of the present disclosure, the voltage generated by a regulator as the voltage VDD may be used.

Further, in each of the above-described embodiments of the present disclosure, the example in which the variable resistance sensor and the amplifier circuit are connected via the PAD circuit has been described. However, the amplifier circuit in each of the above-described embodiments of the present disclosure may be connected to the variable resistance sensor, as an IC for external attachment. The variable resistance sensor and the amplifier circuit may be integrated for packaging. The variable resistance sensor and the amplifier circuit may be integrated for a single chip.

In other words, the amplifier circuit IC chip includes: a first PAD to which a current output from a first end of a first variable resistance sensor is input; a second PAD to which a current output from a first end of a second variable resistance sensor is input; a third PAD configured to supply a predefined voltage to a connection point where a second end of the first variable resistance sensor and a second end of the second variable resistance sensor are connected; a first bias resistance element connected to the first PAD; a second bias resistance element connected to the second PAD; and an I-V converter circuit configured to convert the currents output from the first PAD and the second PAD into voltages, respectively.

In addition, a voltage control circuit configured to control a third voltage of the third PAD based on a first voltage of the first PAD and a second voltage of the second PAD may be included. Further, a first transistor having a drain connected to the third PAD may be included, and the voltage control circuit may be configured to control a gate voltage of the first transistor based on the first voltage of the first PAD and the second voltage of the second PAD. Furthermore, the I-V converter circuit may include an I-V conversion resistance element, and the first bias resistance element, the second bias resistance element, and the I-V conversion resistance element may be arranged on a semiconductor board in proximity to one another.

Moreover, currents output from the first variable resistance sensor and the second variable resistance sensor may change in opposite directions to each other. It is to be noted that resistance values of the first variable resistance sensor and the second variable resistance sensor change in opposite directions to each other.

An angular velocity detection circuit may be configured to include the amplifier circuit in one embodiment of the present disclosure and the first and second variable resistance sensors configured to change the resistance values depending on the angular velocity.

An acceleration detection circuit may be configured to include the amplifier circuit in one embodiment of the present disclosure and the first and second variable resistance sensors configured to change the resistance values depending on the acceleration.

A magnetic field detection circuit may be configured to include the amplifier circuit in one embodiment of the present disclosure and the first and second variable resistance sensors configured to change the resistance values depending on the angular velocity.

Moreover, in one embodiment of the present disclosure, the first bias unit (i.e., first bias resistance, first current source) is configured to determine the bias current flowing across the first variable resistance sensor, and the second bias unit (i.e., second bias resistance, second current source) is configured to determine the bias current flowing across the second variable resistance sensor.

(2) In the above-described amplifier circuit (90), the I-V converter circuit may comprise: a whole differential operational amplifier (101); and a feedback resistance (91, 92) configured to feedback a value of a differential output side of the whole differential operational amplifier to a differential input side.

(3) The above-described amplifier circuit may further comprise a voltage control circuit (120) configured to control the voltage at a connection point of the second end of the first variable resistance sensor and the second end of the second variable resistance sensor, so that an average value of the voltage at a first node of the first end of the first variable resistance sensor and the voltage at a second node of the second end of the second variable resistance sensor is configured to be a predefined reference voltage.

(4) The voltage control circuit (120) may comprise: a current source (124) connected to the connection point of the second end of the first variable resistance sensor and the second end of the second variable resistance sensor; and a current control circuit configured to control a current of the current source.

(5) The voltage control circuit (120) may comprise: a first transistor (124) having a drain connected to the connection point of the second end of the first variable resistance sensor and the second end of the second variable resistance sensor; and a gate voltage control circuit configured to control a gate voltage of the first transistor.

(6) The I-V converter circuit (90) may comprise: a whole differential operational amplifier; and a feedback resistance configured to feedback a value of a differential output side of the whole differential operational amplifier to a differential input side, and a common-mode voltage of the whole differential operational amplifier may be same as the predefined reference voltage.

(7) The first bias unit may be a first bias resistance, and the second bias unit may be a second bias resistance.

(8) The first bias resistance, the second bias resistance, and the feedback resistance may be resistance elements made of an identical material.

(9) A first end of the first bias resistance may be connected to the first end of the first variable resistance sensor, a first end of the second bias resistance may be connected to the first end of the second variable resistance sensor, a second end of the first bias resistance may be connected to the second end of the second bias resistance, and a first voltage may be applied to the connection point of the second end of the first bias resistance and the second end of the second bias resistance.

(10) The first bias unit may be a first current source, the second bias unit may be a second current source, and the first current source and the second current source may be configured to supply the currents in reverse proportion to a resistance value of a reference resistance to the first variable resistance sensor and the second variable resistance sensor, respectively.

(11) The currents output from the first variable resistance sensor and the second variable resistance sensor may change to flow in opposite directions to each other.

(12) The first variable resistance sensor and the second variable resistance sensor may be piezoresistance.

(13) There is provided an angular velocity detection circuit, comprising the amplifier circuit in any one of the above-described (1) to (12), and the first variable resistance sensor and the second variable resistance sensor change resistance values depending on an angular velocity.

(14) There is provided an acceleration velocity detection circuit, comprising the amplifier circuit in any one of the above-described (1) to (12), and the first variable resistance sensor and the second variable resistance sensor change resistance values depending on an acceleration velocity.

(15) There is provided a sensor IC chip, comprising: a first PAD to which a current output from a first end of a first variable resistance sensor is input; a second PAD to which a current output from a first end of a second variable resistance sensor is input; a third PAD configured to supply a predefined voltage to a connection point where a second end of the first variable resistance sensor and a second end of the second variable resistance sensor are connected; a first bias resistance element connected to the first PAD; a second bias resistance element connected to the second PAD; and an I-V converter circuit configured to convert the currents output from the first PAD and the second PAD into voltages, respectively.

(16) The sensor IC chip may further comprise a voltage control circuit configured to control a third voltage of the third PAD based on a first voltage of the first PAD and a second voltage of the second PAD.

(17) The sensor IC chip may further comprise a first transistor having a drain connected to the third PAD, and the voltage control circuit may be configured to control a gate voltage of the first transistor based on the first voltage of the first PAD and the second voltage of the second PAD.

(18) The I-V converter circuit may comprise an I-V conversion resistance element, and the first bias resistance element, the second bias resistance element, and the I-V conversion resistance element may be arranged on a semiconductor board in proximity to one another.

(19) The currents output from the first variable resistance sensor and the second variable resistance sensor may change to flow in opposite directions to each other.

(20) The first variable resistance sensor and the second variable resistance sensor may be piezoresistance.

(21) There is provided an acceleration velocity detection circuit, comprising the sensor IC chip in any one of the above-described (15) to (20), and the first variable resistance sensor and the second variable resistance sensor change resistance values depending on an angular velocity.

(22) There is provided an acceleration velocity detection circuit, comprising the sensor IC chip in any one of the above-described (15) to (20), and the first variable resistance sensor and the second variable resistance sensor change resistance values depending on an acceleration velocity.

According to the present disclosure, in signal processing of converting the resistance change of the variable resistance into a voltage signal and then amplifying the signal, a low noise and a simple configuration are enabled.

Thus, the noise components can be reduced and a high SN ratio is achievable as a whole. In addition, a sensor circuit in which a low noise, a small area, and a low current consumption is made available.

REFERENCE SIGNS LIST 10 acceleration sensor
11 reference voltage input terminal
20 Wheatstone bridge circuit
21-24 piezoresistance elements
30 output amplifier circuit
31 first input terminal
32 second input terminal
33 first voltage input terminal
34 second voltage input terminal
35 reference voltage input terminal
36 output terminal
40 offset voltage adjustment circuit
50 instrumentation amplifier
51-53 operational amplifiers
61-69 resistances
70 converter
71, 72, 73, 74 variable resistance sensors
80 bias unit
81, 82, 83, 84 bias resistances
85, 86 first current sources
87, 88 second current sources
90 I-V converter circuit
91, 92, 93 feedback resistances
100 amplifier circuit
101 first whole differential operational amplifier
102 second operational amplifier
111, 112, 115 output terminals
113, 114 terminals
120 first voltage control circuit
121 average value output circuit
122 third operational amplifier
124 third current source
130 second current control circuit
131 fourth current source
132 fourth operational amplifier
134 reference resistance

The invention claimed is:

1. An amplifier circuit, comprising:
a first bias unit connected to a first end of a first variable resistance sensor;
a second bias unit connected to a first end of a second variable resistance sensor, a second end of the first variable resistance sensor and a second end of the second variable resistance sensor being connected; and
an I-V converter circuit configured to convert currents output from the first end of the first variable resistance sensor and the first end of the second variable resistance sensor into voltages and output the voltages, respectively, wherein the I-V converter circuit comprises:

a full differential operational amplifier having an inverting input terminal, a non-inverting input terminal, a non-inverting output terminal, and an inverting output terminal;

a first feedback resistance connected between the inverting input terminal and the non-inverting output terminal; and a second feedback resistance connected between the non-inverting input terminal and the inverting output terminal, and where the first end of the first variable resistance sensor is connected to the inverting input terminal, and the first end of the second variable resistance sensor is connected to the non-inverting input terminal.

2. The amplifier circuit according to claim 1, further comprising a voltage control circuit configured to control the voltage at a connection point of the second end of the first variable resistance sensor and the second end of the second variable resistance sensor, so that an average value of the voltage at a first node of the first end of the first variable resistance sensor and the voltage at a second node of the second end of the second variable resistance sensor is configured to be a predefined reference voltage.

3. The amplifier circuit according to claim 2,
wherein the voltage control circuit comprises:
a current source connected to the connection point of the second end of the first variable resistance sensor and the second end of the second variable resistance sensor; and
a current control circuit configured to control a current of the current source.

4. The amplifier circuit according to claim 2, wherein the voltage control circuit comprises:
a first transistor having a drain connected to the connection point of the second end of the first variable resistance sensor and the second end of the second variable resistance sensor; and
a gate voltage control circuit configured to control a gate voltage of the first transistor.

5. The amplifier circuit according to claim 2, wherein the I-V converter circuit comprises:
a full differential operational amplifier; and
a feedback resistance configured to feedback a value of a differential output side of the full differential operational amplifier to a differential input side,
wherein a common-mode voltage of the full differential operational amplifier is same as the predefined reference voltage.

6. The amplifier circuit according to claim 1,
wherein the first bias unit is a first bias resistance, and
wherein the second bias unit is a second bias resistance.

7. The amplifier circuit according to claim 6, wherein the first bias resistance, the second bias resistance, and the feedback resistance are resistance elements made of an identical material.

8. The amplifier circuit according to claim 6,
wherein a first end of the first bias resistance is connected to the first end of the first variable resistance sensor,
wherein a first end of the second bias resistance is connected to the first end of the second variable resistance sensor,
wherein a second end of the first bias resistance is connected to the second end of the second bias resistance, and
wherein a first voltage is applied to the connection point of the second end of the first bias resistance and the second end of the second bias resistance.

9. The amplifier circuit according to claim 1,
wherein the first bias unit is a first current source,
wherein the second bias unit is a second current source, and
wherein the first current source and the second current source are configured to supply the currents in reverse proportion to a resistance value of a reference resistance to the first variable resistance sensor and the second variable resistance sensor, respectively.

10. The amplifier circuit according to claim 1, wherein
currents flow in the same direction through the first variable resistance sensor and the second variable resistance sensor, and
the first variable resistance sensor and the second variable resistance sensor have a characteristic of changing their resistance values in opposite directions to each other with respect to an input.

11. The amplifier circuit according to claim 1, wherein the first variable resistance sensor and the second variable resistance sensor are piezoresistance.

12. An angular velocity detection circuit, comprising the amplifier circuit according to claim 1,
wherein the first variable resistance sensor and the second variable resistance sensor change resistance values depending on an angular.

13. An acceleration detection circuit, comprising the amplifier circuit according to claim 1,
wherein the first variable resistance sensor and the second variable resistance sensor change resistance values depending on an acceleration.

* * * * *